US011915923B2

(12) United States Patent
Singhal et al.

(10) Patent No.: US 11,915,923 B2
(45) Date of Patent: Feb. 27, 2024

(54) METHOD TO CLEAN SNO₂ FILM FROM CHAMBER

(71) Applicant: Lam Research Corporation, Fremont, CA (US)

(72) Inventors: Akhil Singhal, Beaverton, OR (US); Dustin Zachary Austin, Corvallis, OR (US); Jeongseok Ha, Portland, OR (US); Pei-Chi Liu, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 569 days.

(21) Appl. No.: 17/090,821

(22) Filed: Nov. 5, 2020

(65) Prior Publication Data

US 2021/0057208 A1 Feb. 25, 2021

Related U.S. Application Data

(62) Division of application No. 16/100,144, filed on Aug. 9, 2018, now Pat. No. 10,840,082.

(51) Int. Cl.
*H01L 21/02* (2006.01)
*H01J 37/32* (2006.01)
*H01L 21/67* (2006.01)

(52) U.S. Cl.
CPC .... *H01L 21/02041* (2013.01); *H01J 37/3244* (2013.01); *H01J 37/32449* (2013.01); *H01L 21/67069* (2013.01)

(58) Field of Classification Search
CPC .......... C23C 16/4405; H01L 21/02041; H01L 21/67069; H01L 21/31122; H01J 37/32449; H01J 37/3244; H01J 37/32862
See application file for complete search history.

(56) References Cited

U.S. PATENT DOCUMENTS 6,211,065 B1* 4/2001 Xi ........................... C23C 16/26
427/535
7,561,247 B2 7/2009 Van Herpen et al.
(Continued)

OTHER PUBLICATIONS

Mohri et al. Plasma Etching of ITO Thin Films Using a CH4/H2 Gas Mixture, 1990, JSAP, vol. 29, pp. 1932-1935 (Year: 1990).*
(Continued)

*Primary Examiner* — Yuechuan Yu
(74) *Attorney, Agent, or Firm* — Penilla IP, APC

(57) ABSTRACT

A plasma processing system is provided. The system includes a hydrogen gas supply and a hydrocarbon gas supply and a processing chamber. The system includes a first mass flow controller (MFC) for controlling hydrogen gas flow into the processing chamber and a second MFC for controlling hydrocarbon gas flow into the processing chamber. The system includes a plasma source for generating plasma at the processing chamber. The plasma is for etching $SnO_2$. The system includes a controller for regulating the first MFC and the second MFC such that a ratio of hydrocarbon gas flow to the hydrogen gas flow into the processing chamber is between 1% and 60% so that when $SnH_4$ is produced during said etching $SnO_2$. The $SnH_4$ is configured to react with hydrocarbon gas to produce an organotin compound that is volatilizable in a reaction that is more kinetically favorable than $SnH_4$ decomposition into Sn powder. Producing the organotin compound enables suction of Sn out of the processing chamber to prevent Sn powder from being deposited on the surfaces of the processing chamber during said etching $SnO_2$.

14 Claims, 11 Drawing Sheets

(56) References Cited

U.S. PATENT DOCUMENTS

| | | |
|---|---|---|
| 10,147,857 B2 | 12/2018 | Lee |
| 10,559,734 B2 | 2/2020 | Lee |
| 2003/0143821 A1* | 7/2003 | Niino .................... C23C 16/509 |
| | | 438/484 |
| 2010/0213162 A1* | 8/2010 | Mochiki ........... H01J 37/32091 |
| | | 216/17 |
| 2013/0001599 A1 | 1/2013 | Lee |
| 2013/0248896 A1 | 9/2013 | Lee |
| 2016/0005723 A1 | 1/2016 | Lee |
| 2017/0040307 A1 | 2/2017 | Lee |

OTHER PUBLICATIONS

JP2021-506627, Notice of Reasons for Refusal, Eng. translation, Meisei Int'l Patent Firm, dated Aug. 31, 2023.

\* cited by examiner

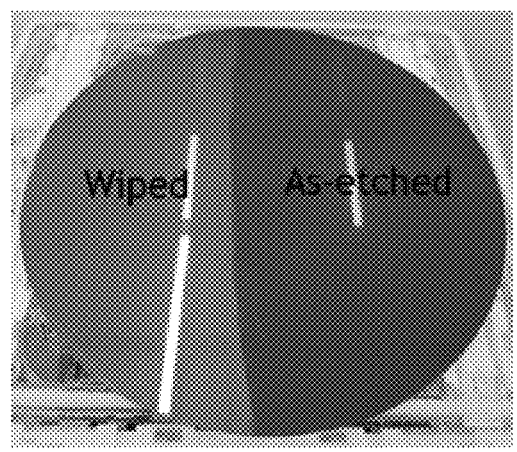
Fig. 8A
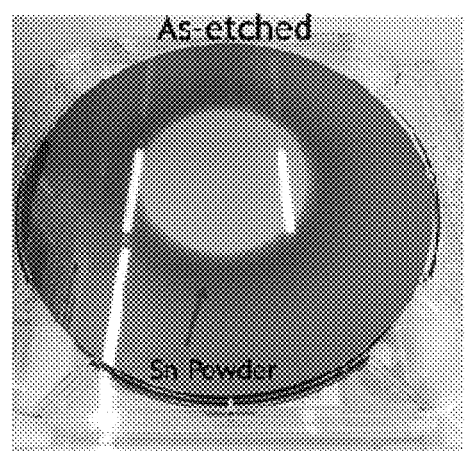 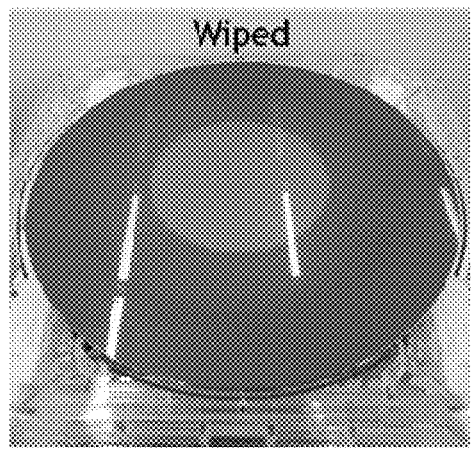
Fig. 8B            Fig. 8C
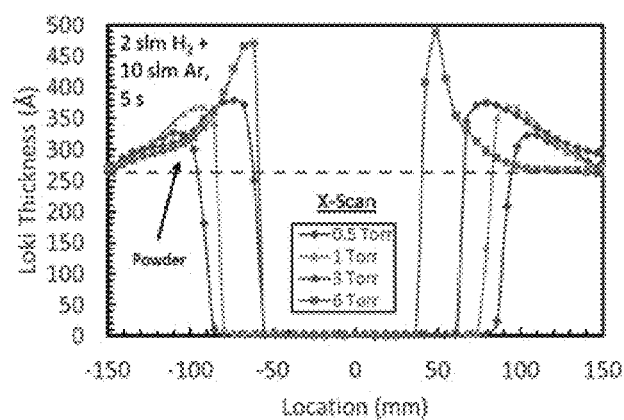
Fig. 8D

METHOD TO CLEAN SNO$_2$ FILM FROM CHAMBER

CLAIM OF PRIORITY

This application is a Divisional application under 35 U.S.C. 120 of prior U.S. application Ser. No. 16/100,144, filed Aug. 9, 2018, and entitled, "Method to Clean SNO$_2$ Film From Chamber", which is incorporated herein by reference in its entirety for all purposes.

TECHNICAL FIELD

The present embodiments relate to semiconductor substrate processing methods and equipment tools, and more particularly, methods and systems for reducing tin oxide powder formation during plasma etching processes such as for cleaning a plasma processing chamber.

BACKGROUND

The manufacturing of integrated circuits (ICs) often involves plasma processing steps. During plasma processing, a substrate such as a semiconductor, a dielectric, or a metal substrate, is subjected to etchants in the presence of a plasma in a vacuumed processing chamber. As a result, the substrate either has material etched by the plasma, or has material deposited on the exposed surfaces of the substrate. While most of the reactants and by-products of plasma processing are exhausted out of the chamber by vacuum pumps, unwanted particles may remain inside the chamber by attaching to the walls and componentry of the processing chamber. Over many iterations of plasma processing steps, a film comprising of one or more by-products of the plasma processing may develop. The presence of such a film may contaminate successive processing steps as the particles of the film may sublimate and adversely impact process chemistry. Additionally, portions of the film may peel-off from various surfaces and result in defects on the wafer substrate.

It is in this context that embodiments arise.

SUMMARY

The present embodiments relate to an improved plasma chemistry for etching and cleaning tin(IV) oxide (SnO$_2$, also known as stannic oxide) residue from a plasma processing chamber. Embodiments of the present disclosure provide for rotating the wafer without rotation of the pedestal, which advantageously filters out both chamber and pedestal asymmetries. It should be appreciated that the present embodiments can be implemented in numerous ways, such as a method, an apparatus, a system, a device, or a computer program on a computer readable medium. Several embodiments are described below.

In one embodiment, a method for cleaning SnO$_2$ from a processing chamber is provided. The method includes an operation that introduces hydrocarbon gas and hydrogen gas into a plasma processing system, where a ratio of a flow of hydrocarbon gas and a flow of hydrogen gas is between 1% and 60%. The method further provides for etching the SnO$_2$ residue from surfaces of the processing chamber using plasma generated by a plasma source of the plasma processing system, the etching the SnO$_2$ residue with the hydrogen gas produces stannane (SnH$_4$), and the SnH$_4$ gas reacts with the hydrocarbon gas to produce an organotin compound that is volatilizable. The method also provides for evacuating the processing chamber of the organotin compound, wherein said introducing the hydrocarbon gas along with the hydrogen gas at the ratio reduces a rate of the SnH$_4$ gas decomposition into Sn powder.

In another embodiment a method for patterning an SnO$_2$ layer while reducing tin (Sn) powder formation on surfaces of a processing chamber of a plasma processing system is provided. The method includes an operation for depositing a layer of SnO$_2$ on a substrate and applying an etch mask to the layer of SnO$_2$ to resist etching. The method also provides for introducing hydrocarbon gas and hydrogen gas into the plasma processing system, where a ratio of a flow of hydrocarbon gas to hydrogen gas is between about 1% and about 60%. The method further provides for etching the layer of SnO$_2$ where exposed by the etch mask using plasma generated by a plasma source, the etching of the SnO$_2$ produces SnH$_4$ gas and the SnH$_4$ gas reacts with the hydrocarbon gas to produce an organotin compound that is volatizable. Moreover, the method includes evacuating the processing chamber of the organotin compound, wherein said introducing the hydrocarbon gas along with the hydrogen gas at the ratio of between 1% to 60% reduces a rate of SnH$_4$ decomposition into Sn powder.

In another embodiment, a plasma processing system is provided. The system includes a hydrogen gas supply and a hydrocarbon gas supply, a processing chamber, and a first mass flow controller for controlling hydrogen gas flow into the processing chamber as a second MFC for controlling hydrocarbon gas flow into the processing chamber. The system further provides a plasma source for generating plasma at the processing chamber, the plasma is for etching SnO$_2$. Moreover, the plasma processing system includes a controller for regulating the first MFC and the second MFC such that a ratio of hydrocarbon gas flow to the hydrogen gas flow into the processing chamber is between 1% and 60% so that when SnH$_4$ is produced during said etching the SnO$_2$, the SnH$_4$ reacts hydrocarbon gas to produce an organotin compound that is volatizable in a reaction that is more kinetically favorable than SnH$_4$ decomposition into Sn powder, wherein producing the organotin compound enables suction of Sn out of the processing chamber to prevent Sn powder from being deposited on the surfaces of the processing chamber during said etching SnO$_2$.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

FIGS. 8A-8D show results of etching $SnO_2$ and the resulting formation of Sn powder using hydrogen plasma chemistry, according to various embodiments.

DETAILED DESCRIPTION

Figure 1A:
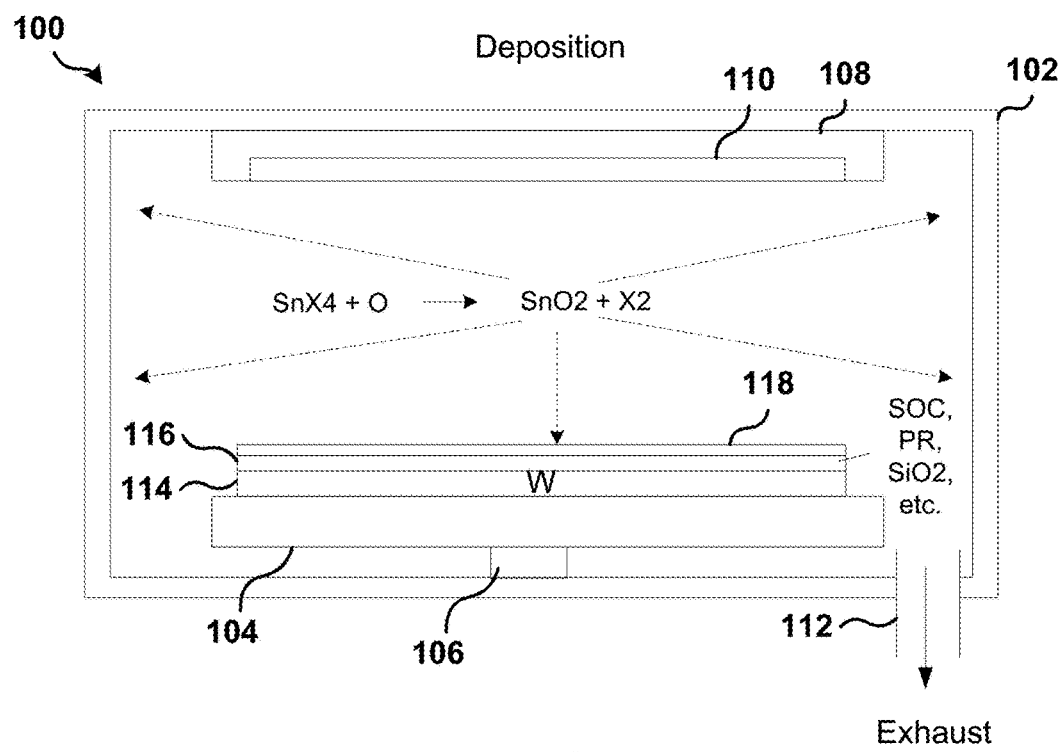
FIG. 1A shows a simplified processing chamber where a layer of SnO$_2$ is being deposited on a substrate, according to one embodiment.

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

$SnO_2$ layers (e.g., thin films) are contemplated to be used in substrate processing for a variety of applications. Some of these include as an extreme ultraviolet (EUV) hard mask (HM), as a spacer and mandrel core for patterning, as a gapfill oxide, as a hard mask, and as etch stop layers. $SnO_2$ films may be deposited on a substrate in a number of ways. In one chemical vapor deposition (CVD) process, the substrate is exposed to vapor phase reactant containing tin (e.g., $Sn(CH_3)_4$, $SnCl_4$, Sn, etc.) in the presence of atomic oxygen to form a layer of $SnO_2$ on the substrate.

Deposition of $SnO_2$ often will result in an accumulation of residue films on the inner surfaces of the plasma chamber, including the inner walls of the chamber, the showerhead, electrodes, substrate supports, the chuck, etc. When $SnO_2$ films develop on the inner surfaces of the plasma chamber, they are prone to contaminate the wafer substrate by peeling-off therefrom due to poor adhesion and buildup by stress within the film. Therefore, periodic cleaning of the processing chamber is necessary to prevent contamination of wafers.

It is envisioned that one way of cleaning $SnO_2$ film from within the processing chamber is to etch the $SnO_2$ film with plasma. $SnO_2$ etches readily in various chemistries such as $H_2$, $Cl_2$, Br, HBr, $BCl_3$, HI, and $I_2$. However, as many processing chambers in use are made with aluminum components, chemistries such as $Cl_2$, Br, HBr, HI, and $I_2$ should be avoided because they cause degradation of the aluminum components. It is therefore contemplated that $H_2$ plasma chemistry is to be used for etching $SnO_2$ films from the inner walls and components of processing chambers such as those with aluminum components.

When $SnO_2$ films are etched with $H_2$ chemistry, volatile $SnH_4$ is produced and can be evacuated from the reactor. However, it has also been found in relation to the present disclosure that etching of $SnO_2$ films using $H_2$ plasma chemistry forms Sn residue in powder form. For example, at typical pressure and temperature ranges of reactors in industry use (e.g., Striker® product family manufactured by Lam Research Corporation of Fremont, CA), tin powder is formed in nontrivial quantities by decomposition of $SnH_4$. This is the case whether the reactor is configured for capacitively-coupled plasma (CCP) or with an inductively-coupled plasma (ICP) source. The tin powder that is formed is a source of contamination for subsequent processing steps and can result in defects in processing operations.

Embodiments described here enable the etching of $SnO_2$ with $H_2$ plasma chemistry while reducing or nearly eliminating the formation of tin powder. In particular, various hydrocarbon gases have been tested for their ability to provide a thermodynamically and kinetically favorable reaction pathway to form a volatile organotin compound from $SnH_4$ over the decomposition of $SnH_4$ to tin powder. Various hydrocarbon gases are being proposed toward this end, as well as their relative proportions to $H_2$ for optimal effectiveness in reducing the formation of tin powder.

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

As used herein, a "favorable" reaction is used to refer a kinetically favorable reaction and/or a thermodynamically favorable reaction under the conditions in which the reaction is contemplated to take place (e.g., the pressures, temperature, reactant concentrations, and the presence of plasma of a plasma processing chamber). A thermodynamically favorable reaction is one in which the products of the reaction have a lower free energy than the reactants. A kinetically favorable reaction is one in which the activation energy of the reaction is low enough such that the rate of the reaction may take place within time frame that is typically used in substrate processing operations. As used herein, when a reactant may proceed by a first or second reaction and a first reaction is said to be more favorable than a second reaction, it is generally meant that the first reaction may be more thermodynamically favorable (e.g., have a Gibbs free energy that is more negative than that of the second reaction), and/or be more kinetically favorable than the second reaction (e.g., the first reaction has a reaction rate that is greater than that of the second reaction). As used herein, a more kinetically favorable first reaction is one that is induced by the conditions of the plasma processing chamber to proceed at a rate that is greater than a second reaction such that the reactant is more likely than not to proceed by the first reaction than the second reaction.

FIG. 1A shows a simplified processing chamber 100 where a $SnO_2$ layer 118 is being deposited on a substrate, according to one embodiment. The processing chamber 100 includes walls 102, chuck 104, lower electrode 106, upper electrode 108, showerhead 110, exhaust 112, wafer 114, layer 116, and a $SnO_2$ layer 118 that is being formed by the deposition process. In certain embodiments, $SnO_2$ may be deposited by chemical vapor deposition (CVD), atomic layer deposition (ALD), and others. In an example CVD process, a tin precursor (e.g., $SnCl_4$) is introduced into the processing chamber 100 via showerhead 110 in the presence of oxygen. In this example, the Sn reacts with the substrate as well as with oxygen to form a layer of $SnO_2$. By-products such as $Cl_2$ and unreacted tin precursor may be exhausted from the chamber through exhaust 112.

The layer 116 on which the $SnO_2$ layer 118 is being deposited may include spin-on-carbon (SOC), photoresist (PR), silicon layers, metallic layers, glass, etc. During $SnO_2$ deposition, a film of $SnO_2$ forms on the interior surfaces of the processing chamber 100, including the inner surfaces of walls 102, chuck 104, lower electrode 106, upper electrode 108, and showerhead 110. Over a plurality of iterations of the $SnO_2$ deposition process, the film of $SnO_2$ formed on the interior surfaces will grow and may be a source of contamination in subsequent plasma processing steps. As a result, the processing chamber is routinely subject to cleaning steps using plasma etching.

Figure 1B:
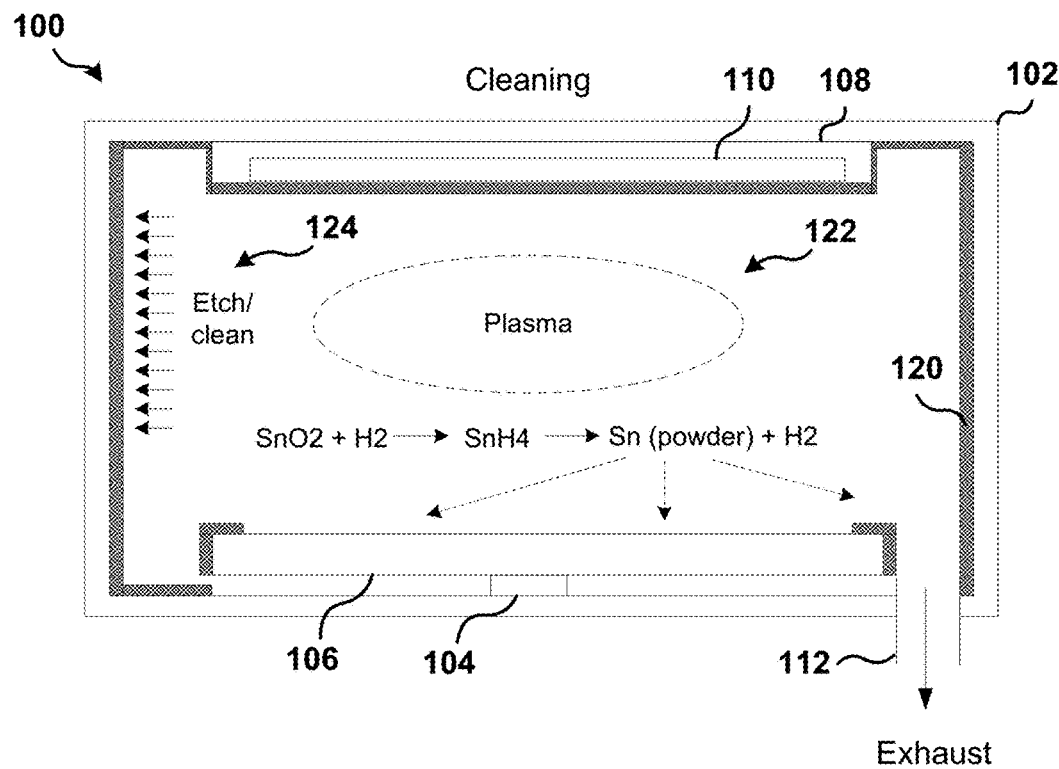
FIG. 1B illustrates a cleaning process involving plasma etching of SnO$_2$ film from the inner surfaces of the processing chamber, according to one embodiment.

FIG. 1B illustrates a cleaning process involving plasma etching of $SnO_2$ film 120 from the inner surfaces of the processing chamber 100, according to one embodiment. The $SnO_2$ film 120 is shown to adhere to the inner surface of walls 102, lower electrode 106, upper electrode 108, and showerhead 110. The $SnO_2$ film 120 may likewise form on components within the processing chamber that are not shown.

When plasma 122 is struck in the processing chamber 122, the plasma 122 begins etching 124 of the $SnO_2$ film 120. In one embodiment using $H_2$ plasma chemistry, the following reaction takes place in the presence of plasma:

$$SnO_2 + H_2 \rightarrow SnH_4 \quad (1)$$

$SnH_4$ is a volatile compound at the temperature and pressure ranges used for sustaining the plasma 122. As a result, much of the $SnH_4$ that is generated as a result of the etching 124 process is evacuated from the processing chamber 100. However, a portion of the $SnH_4$ gas will tend to decompose into tin powder described by the following reaction:

$$SnH_4 \rightarrow Sn(powder) + H_2 \quad (2)$$

Decomposition of $SnH_4$ has been observed in relation to the present disclosure to occur at a higher rate in plasma processing regimes having a lower density of radicals and ions within plasma that is formed. Moreover, decomposition of $SnH_4$ has also been observed to occur at higher rates in processing regimes having higher pressures. The amount of Sn powder formed by cleaning process will vary depending upon the amount or thickness of the $SnO_2$ film 120, as well as various other parameters associated with the plasma processing regime, such as temperature, pressure, the frequency of the radiofrequency (RF) power, and whether the plasma is generated via CCP or ICP. The amount of Sn powder formed by cleaning processes may thus vary between about 0.001 grams or less to about 10 grams or more. When Sn powder is formed, it cannot be exhausted from the chamber and is removed manually through time-consuming cleaning processes.

An improved plasma chemistry is therefore contemplated to enable etching and cleaning of $SnO_2$ films from the inner surfaces of processing chambers while reducing $SnH_4$ decomposition into Sn powder. In one embodiment shown in FIG. 2A, a hydrocarbon gas is introduced into the processing chamber along with $H_2$. The hydrocarbon gas is contemplated to provide a kinetically favorable reaction pathway for the $SnH_4$ gas to form a volatile organotin compound. For example, the reaction rate of $k_1$ is contemplated to be greater than $k_2$ by a factor of about 2 to about $10^{12}$ or greater, or by a factor of between about $10^2$ to about $10^9$, or by a factor of about $10^3$ to about $10^6$, depending upon various parameters and embodiments. The organotin compound is volatile and is evacuated from the processing chamber. As a result of the $SnH_4$ and hydrocarbon reaction, the $SnH_4$ decomposes to Sn powder to a greatly reduced extent and is undetectable under many circumstances.

Figure 2A:
FIGS. 2A and 2B show embodiments of a chemistry that reduce the formation of Sn powder during etching and cleaning of SnO$_2$ thin films from a processing chamber.

In one embodiment in relation to FIG. 2A, the ratio of hydrocarbon flow to $H_2$ flow is between about 1% to about 60%, or about 2% to 10%, or about 5% to 8%. In one embodiment, the temperature of the processing chamber is kept at about 65° C. to about 300° C. In one embodiment, the RF power that is supplied is about 500 W to about 5000 W. In various embodiments, the frequency of the RF power is about 13.56 MHz or about 27 MHz. For various embodiments, 27 MHz may be used for faster etch rates due to higher concentration of hydrogen radicals. In various embodiments, the pressure of the chamber may be set at about 0.1 Torr to about 10 Torr. A higher pressure within this range is contemplated to have greater effectiveness at etching chamber components that are more centrally located such as the electrodes, whereas a lower pressure within the range is contemplated to be better suited at etching components towards the outer locations of the chamber. Additionally, the plasma chemistry of hydrocarbon with $H_2$ is effective reducing tin powder formation in both ICP and CCP configurations.

Figure 2B:
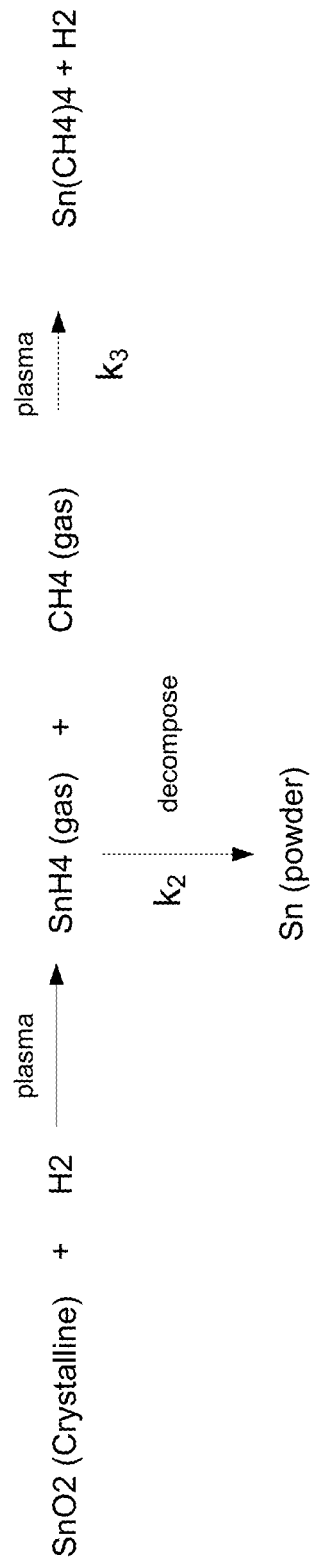

FIG. 2B shows an additional embodiment of a reaction that reduces the formation of tin powder during etching and cleaning processes of $SnO_2$ thin films from a chamber. In the embodiment of FIG. 2B, $CH_4$ is introduced into the chamber along with $H_2$ in the presence of plasma. When gaseous SH4 is produced from plasma etching of $SnO_2$ film from the inner surfaces of the chamber, $CH_4$ reacts with the $SnH_4$ to produce $Sn(CH_3)_4$. The reaction pathway of $SnH_4$ and $CH_4$ to form $Sn(CH_3)_4$ is more kinetically favorable than $SnH_4$ decomposition to Sn powder. For example, reaction rate $k_3$ is contemplated to be higher than reaction rate $k_2$ by a factor of about 2 to about $10^{12}$ or greater, or by a factor of between $10^2$ to $10^9$, or by a factor of about $10^3$ to $10^6$, depending upon various parameters and embodiments. $Sn(CH_3)_4$ is volatile at the temperatures and pressures maintained within the chamber and is readily evacuated from the chamber. As a result, the plasma chemistry of $CH_4$ and $H_2$ is contemplated to reduce the amount of tin powder that is formed during plasma etching and cleaning processes of $SnO_2$ film from the chamber.

In one embodiment in relation to FIG. 2B, the ratio of $CH_4$ flow to $H_2$ flow is between about 1% to about 60%, or about 2% to 10%, or about 5% to about 8%. In one embodiment, the temperature of the processing chamber is kept at about 65° C. to about 300° C. In one embodiment, the RF power that is supplied is about 500 W to about 5000 W. In various embodiments, the frequency of the RF power is about 13.56 MHz or about 27 MHz. For various embodiments, 27 MHz may be used for faster etch rates due to higher concentration of hydrogen radicals. In various embodiments, the pressure of the chamber may be set at about 0.1 Torr to about 10 Torr. A higher pressure within this range is contemplated to have greater effectiveness at etching chamber components that are more centrally located such as the electrodes, whereas a lower pressure within the range is contemplated to be better suited at etching components towards the outer locations of the chamber. Additionally, the plasma chemistry of $CH_4$ with $H_2$ is effective at reducing tin powder formation in both ICP and CCP configurations.

Figure 3:
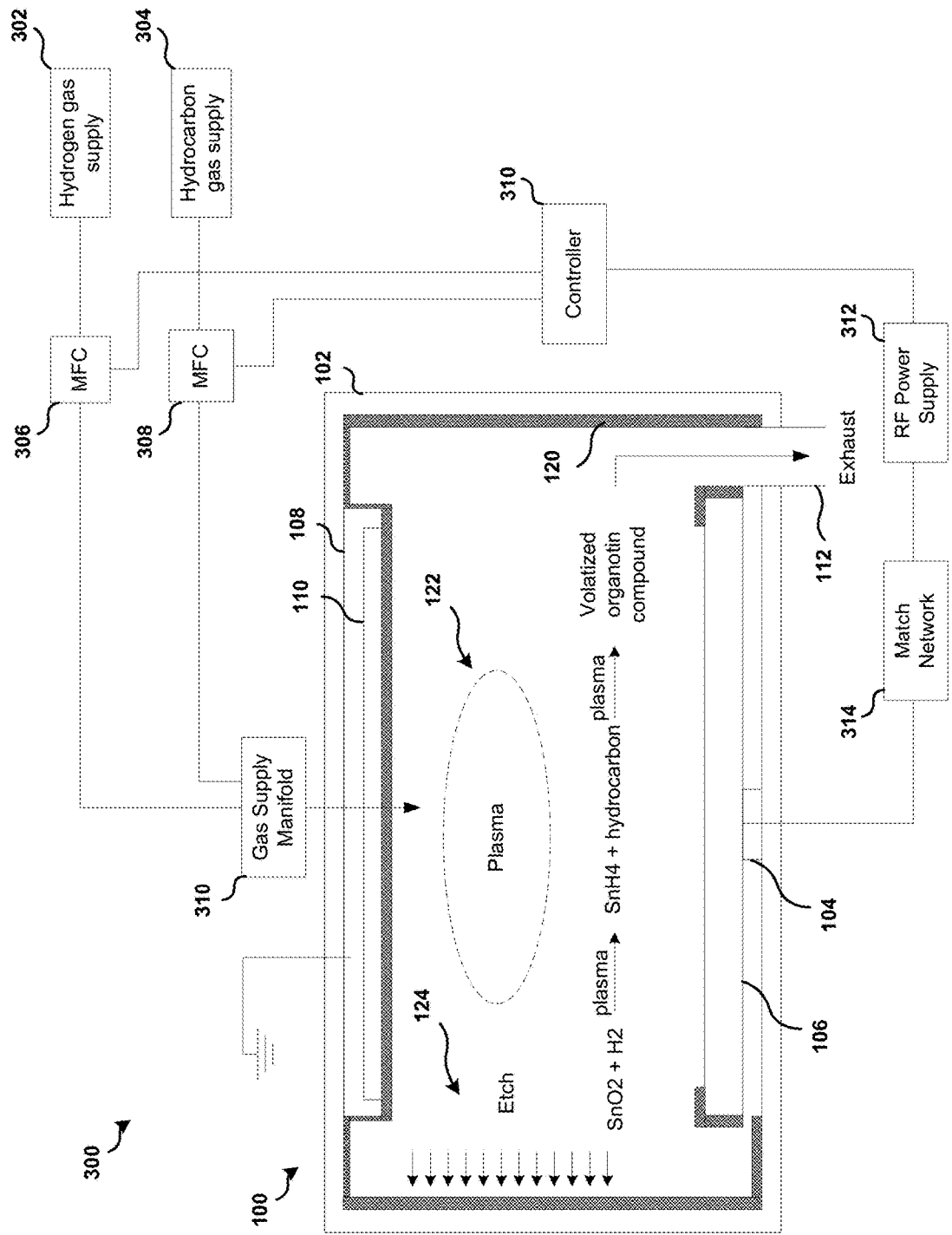
FIG. 3 shows a diagram of a plasma processing system undergoing cleaning of SnO$_2$ residue from the processing chamber using a mixture of hydrogen and hydrocarbon gases, according to one embodiment.

FIG. 3 shows a diagram of a plasma processing system 300 undergoing cleaning of $SnO_2$ residue 120 from the processing chamber 100 using a mixture of hydrogen and hydrocarbon gases, according to one embodiment. $H_2$ is supplied by a hydrogen gas supply 302 while the hydrocarbon gas is supplied by hydrocarbon gas supply 304. The flows of the $H_2$ and the hydrocarbon gas are controlled by MFCs 306 and 308, respectively, both of which are controlled by controller 310. Both of the $H_2$ gas and the hydrocarbon gas flow through respective lines to gas supply manifold 310, which mixes the gases and feeds the resulting gas mixture to showerhead 110. The showerhead 110 distributes the mixture of $H_2$ and hydrocarbon gases into the processing chamber 100 via a plurality of inlets. An RF power supply 312 and a match network 314 is shown to supply power to the lower electrode 106. The upper electrode 108 is positioned parallel to the bottom electrode and is grounded. A plasma 122 is struck and maintained between the upper electrode 108 and the lower electrode 106. In other embodiments, the RF power supply 312 may supply power to the upper electrode 108 while the bottom electrode 106 is grounded.

The $SnO_2$ residue 120 is shown to adhere to and coat surfaces of the chamber 100. During preceding $SnO_2$ deposition processes, $SnO_2$ residue 120 may develop as crystalline layers, matrices, tubules, or amorphously, etc. on the surfaces of the processing chamber 100. The plasma 122 energizes the hydrogen gas to react with the $SnO_2$ residue 124 to produce $SnH_4$. The plasma 122 also energizes the hydrocarbon gas such that it reacts with the $SnH_4$ to produce a volatilized organotin compound, which is exhausted from the processing chamber 100 through exhaust 112. In one embodiment, $CH_4$ is used as the hydrocarbon gas. When $CH_4$ is subjected to the plasma 122, reactive ions and radicals are generated such as $\cdot CH_4+$, $\cdot CH_3$, $CH_3+$, $\cdot CH_2+$, $\cdot CH+$, $\cdot C+$, $CH_5+$, etc. These species of ions and radicals are highly reactive with $SnH_4$, $CH_4$, and with each other. One of the resulting products is $SnR_4$, where R is $CH_3$, $C_2H_5$, $C_2H_3$, or other carbon species. Additionally, some of the $CH_4$ radicals and ions will react with each other to form carbonaceous polymers at a rate that is a function of the concentration of $CH_4$ flowing into the processing chamber 100. When these carbonaceous polymers grow in molecular weight, their tendency towards vaporization decreases due to a number of kinetic and intermolecular interaction factors.

The contemplated range of hydrocarbon gas flow with respect to hydrogen gas flow is therefore contemplated to be such that a sufficient concentration of $CH_4$ radicals and ions are available to react with $SnH_4$ to prevent $SnH_4$ decomposition to Sn powder. On the other hand, the proportion of hydrogen gas flow with respect to hydrogen gas flow is also contemplated to be low enough to ensure that carbonaceous polymers do not form to an extent that they are no longer in a gaseous state at the temperature and pressure ranges used for etching the $SnO_2$ residue. As determined empirically, this range is found to be between about 1% and about 60%, or between about 2% and 10% of hydrocarbon flow to hydrogen flow, or about 7%.

Certain embodiments may have the ratio of hydrocarbon flow to $H_2$ flow to be higher than 60%, such as up 100% (e.g., hydrocarbon only). However, the likelihood of forming carbonaceous polymers and their subsequent deposition or condensation is increased as the proportion of hydrocarbon is increased. On the other hand, smaller flows of hydrocarbon gas may also be used such that the ratio of hydrocarbon gas flow to hydrogen gas flow is below 1%. However, it has been found that there is insufficient hydrocarbon reactant when the ratio of hydrocarbon gas flow to hydrogen gas flow is less than about 1%, which results in some amount of $SnH_4$ decomposition into Sn powder. Additionally, once $SnH_4$ decomposes into Sn powder, it is no longer reactive with the hydrocarbon gas at the plasma conditions contemplated. The Sn powder must therefore be manually cleaned out of the processing chamber and cannot be volatilized at typical temperature and pressure ranges used for the processing chamber.

Figure 4:
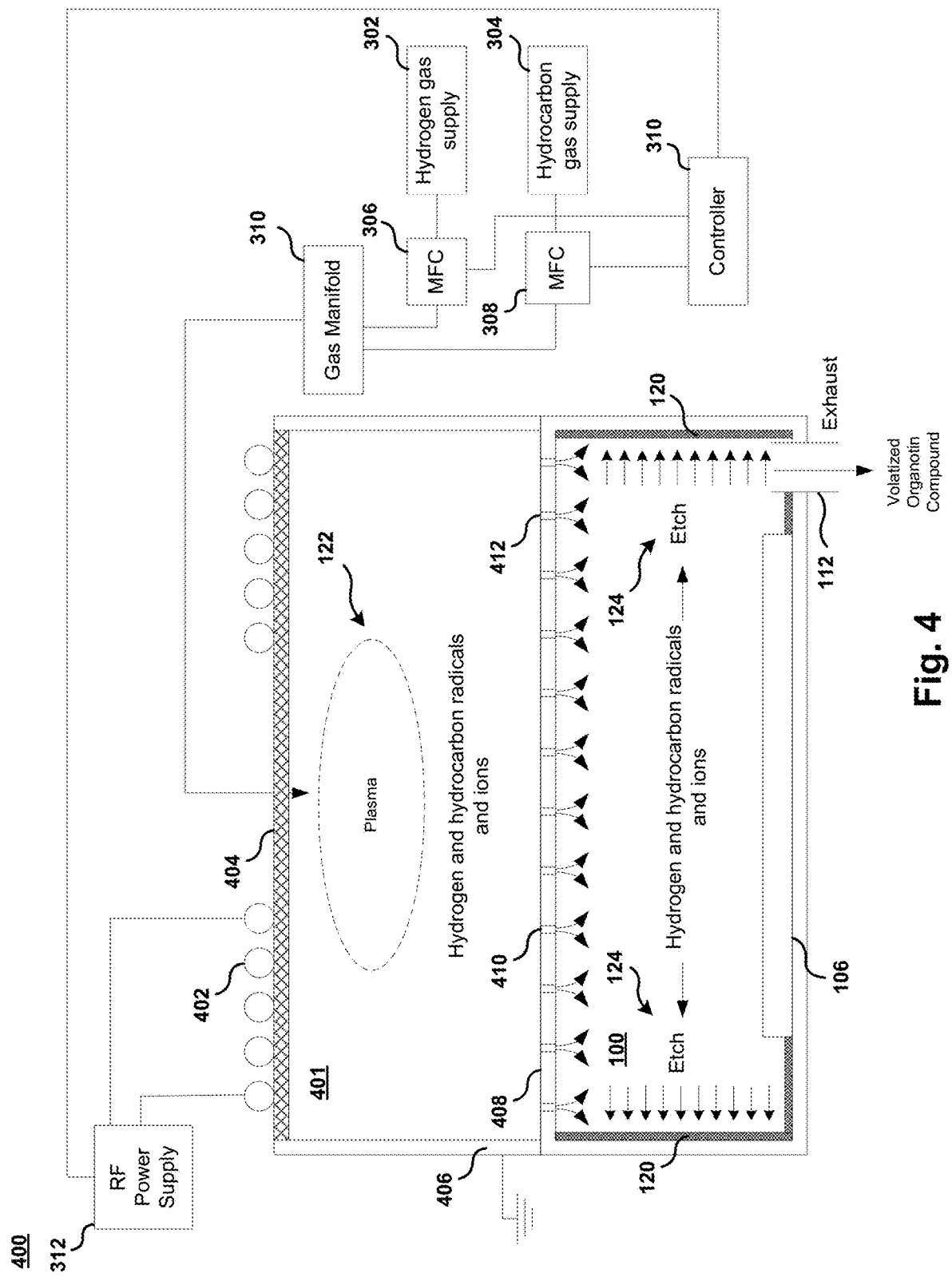
FIG. 4 illustrates a simplified schematic of an inductively coupled plasma (ICP) processing system in accordance with the $SnO_2$ residue cleaning methods described herein, according to one embodiment.

FIG. 4 illustrates a simplified schematic of an inductively coupled plasma (ICP) processing system 400 in accordance with the $SnO_2$ residue cleaning methods described herein, according to one embodiment. The ICP processing system 400 is shown to include an ICP source 401 and a processing chamber 100 separated by a wall 408. The ICP source 401 is formed by chamber walls 406 and dielectric window 404. A gas inlet (not shown) introduces a mixture of hydrogen and hydrocarbon gas into the chamber of the ICP source 401. The ICP source 401 further includes an inductive source 402, which in some embodiments take the form of a coil that is positioned at the dielectric window 404. The inductive source 402 is powered by RF power supply 403 and generates a time-varying magnetic field that energizes gases present in the chamber of the ICP source 401 into the plasma 122. The ICP source 401 may be generally cylindrical in shape, dome-like in shape, conical in shape, or some other shape that enables the inductive source 402 to induce and maintain plasma in the chamber of the ICP source 401. In some embodiments, the chamber wall 406 is grounded, as shown, while in other embodiments, a portion of the inductive source 402 is grounded.

As a result of the plasma 122, hydrogen and hydrocarbon radicals and ions are generated. In some configurations, the plasma produces ·H, H+, and H− from the hydrogen gas. If $CH_4$ is used as the hydrocarbon gas, the plasma produces $\cdot CH_4+$, $\cdot CH_3$, $CH_3+$, $\cdot CH_2+$, $\cdot CH+$, $\cdot C+$, $CH_5+$, and other radicals and ions. These radicals and ions are introduced into the processing chamber 100 via openings 410 in wall 408. The hydrogen containing radicals and ions diffuse about the processing chamber 100 and react with the $SnO_2$ residue 120 to form $SnH_4$, the macroscopic effect of which is etching 124 of the $SnO_2$ residue 120. Once $SnH_4$ is produced during etching 124, carbon containing radicals and ions are present in the processing chamber 100 to react with the $SnH_4$ to form an organotin compound such as $Sn(CH_3)_4$, or $Sn_2(CH_3)_6$, or $SnR_4$, where R is hydrogen or an alkyl group.

Organotin with simple alkyl groups such as methyl, ethyl, and so forth remain volatilized and do not undergo deposition at the temperatures and pressures of the processing chamber 100 used for the etching 124. However, when alkyl groups of the organotin compounds reach certain lengths, molecular weights, and branching, the organotin compounds become less volatile. As a result, the flow of hydrocarbon to hydrogen is found to be effective at between about 1% to about 60% to reduce organotin compound deposition while supplying sufficient hydrocarbon for reacting with $SnH_4$. Further, it has been found in relation to the present embodiments that effective ICP configurations have a temperature range of about 40° C. to about 500° C., or about 100° C. to about 400° C., or about 150° C. to about 180° C., or about 160° C., a pressure range of 0.1 Torr to about 10 Torr, or about 1 Torr to about 8 Torr, or about 7 Torr, and a power of about 50 W to about 5000 W, or about 100 W to about 4000 W, or about 250 W to about 1000 W at about 13.56, 27, or 35 MHz.

While the embodiment shown in FIG. 4 is such that the ICP source 401 is connected to the processing chamber 100 via a plurality of openings 410, other embodiments are envisioned wherein the ICP source 401 is able to feed the hydrogen and hydrocarbon radicals and ions into the processing chamber 100 via one or more interconnect channel. In other embodiments, the ICP source 401 is contemplated to be a remote source of plasma and is not necessarily adjacent to the processing chamber 100 as such in the embodiment of FIG. 4.

Figure 5:
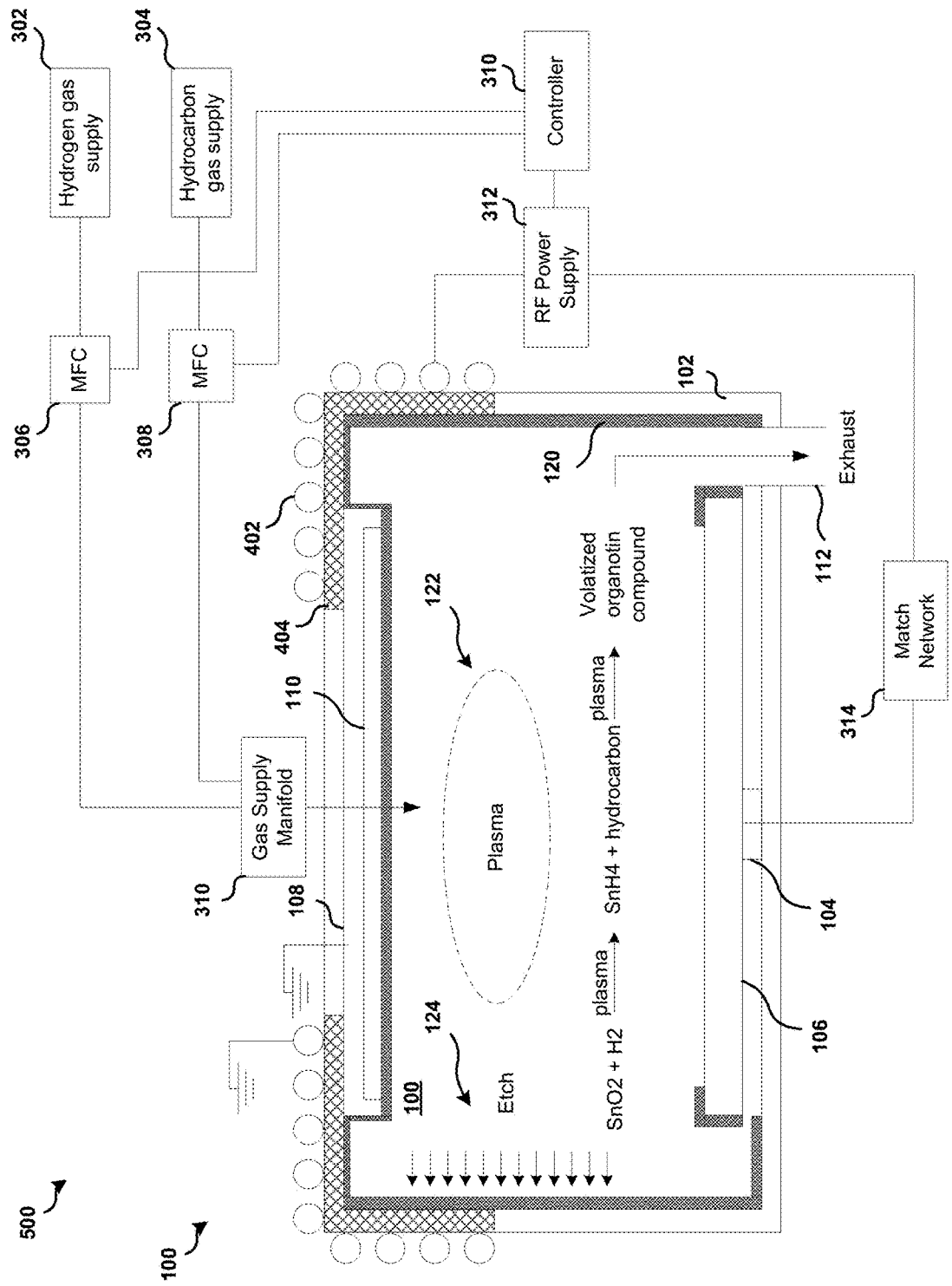
FIG. 5 shows a simplified schematic of ICP and CCP plasma processing system undergoing cleaning of $SnO_2$ residue from the inner walls of the processing chamber in accordance with one embodiment.

FIG. 5 shows a simplified schematic of hybrid ICP and CCP plasma processing system 500 undergoing cleaning of $SnO_2$ residue 120 from the inner walls 102 of the processing chamber 100 in accordance with one embodiment. Hydrogen and hydrocarbon gas are supplied by hydrogen gas supply 302 and hydrocarbon gas supply 304 via MFCs 306 and 308 and gas supply manifold 310. In this embodiment, plasma 122 is generated using both CCP and ICP configurations. RF power supply 501 supplies power to the lower electrode 106 while the upper electrode 108 is grounded. An electric field is thereby generated between the lower electrode 106 and the upper electrode 108, which energizes the hydrocarbon and hydrogen gases to form plasma 122. The plasma 122 is additionally energized by the magnetic field supplied by the inductive source 402, which helps to maintain and control the plasma 122 in density and location. In the configuration shown, the inductive source 402 is in the shape of a coil and is grounded at one or both ends of the coil.

Figure 6:
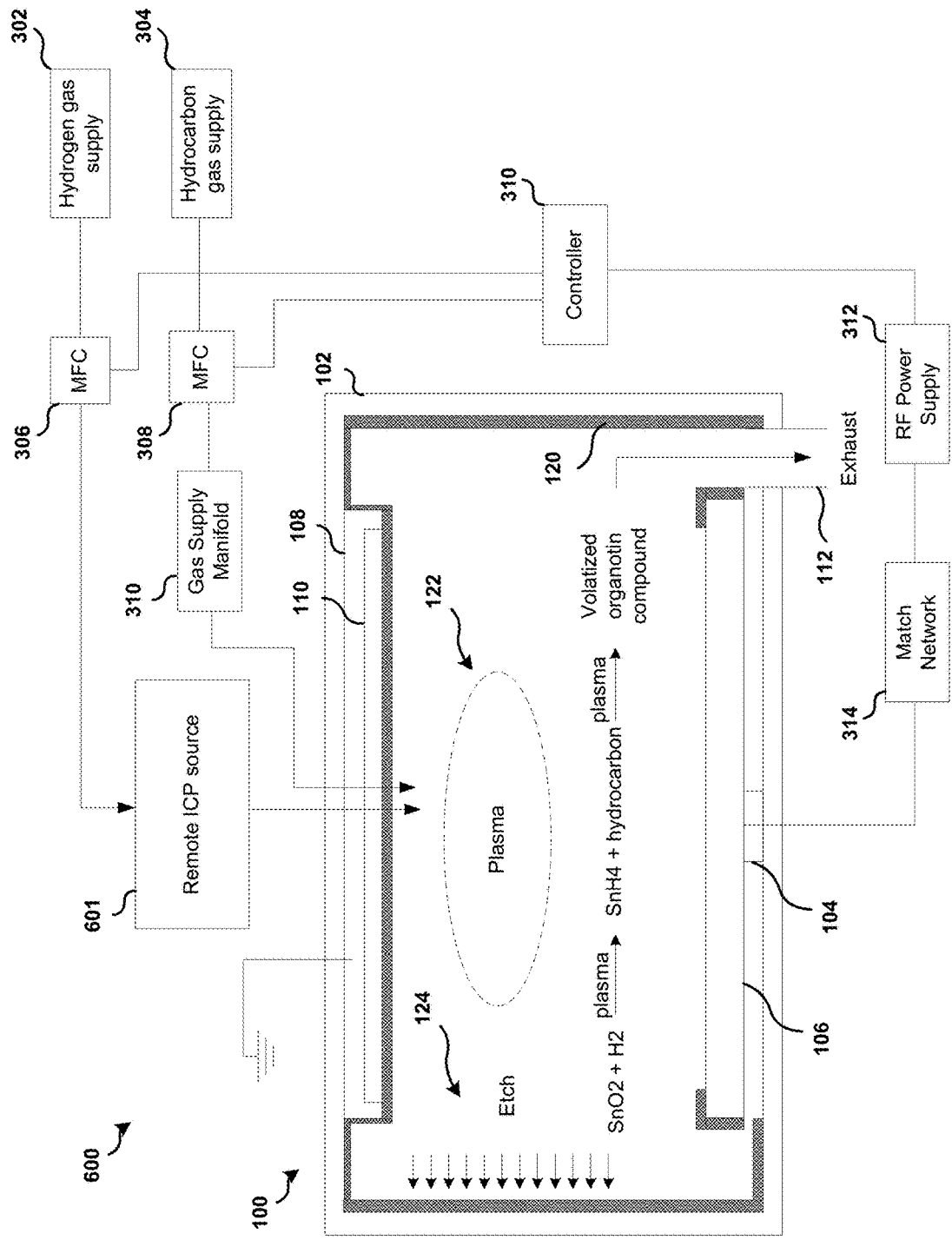
FIG. 6 shows a simplified schematic of a plasma processing system having a CCP configuration and being connected to a remote ICP source for cleaning of $SnO_2$ residue from the processing chamber, in accordance with one embodiment.

FIG. 6 shows a simplified schematic of a plasma processing system 600 having a CCP configuration and being connected to a remote ICP source 601 for cleaning of $SnO_2$ residue 120 from the processing chamber 100, in accordance with one embodiment. Hydrogen gas is provided to the remote ICP source 601 where it is energized via magnetic fields. Once energized, the free radicals and ions are flown into the processing chamber 100 for etching 124 of the $SnO_2$ residue. Hydrocarbon gas is provided into the processing chamber and is energized into a plasma 122, reacting with $SnH_4$ that is produced as a result of etching the $SnO_2$ residue 120. As a result, $SnO_2$ residue 120 may be cleaned from a processing chamber 100 without forming Sn powder (e.g., or effectively reducing such formation) using remote ICP source 601 for activating the hydrogen gas and CCP for activating the hydrocarbon source. In certain embodiments, the remote ICP source 601 may be used to activate (e.g., energize, ionize, dissociate, generate free radicals, etc.) the hydrocarbon gas while the CCP may be used to activate the hydrogen gas.

In another embodiment having a remote ICP source coupled with a processing chamber, Ar and/or He gas is contemplated to be introduced into the ICP source while hydrocarbon and hydrogen gas are introduced into the processing chamber. When plasma is generated from the Ar and/or He gas in the remote ICP source, Ar and He ions are fed into the processing chamber to energize the hydrocarbon and hydrogen gases. Ar and He ions are highly reactive and produce hydrocarbon and hydrogen ions and radicals once in the processing chamber. The hydrogen ions and radicals react with the $SnO_2$ residue to form $SnH_4$ and the hydrocarbon radicals and ions react with the $SnH_4$ to form the volatile organotin compound to be evacuated from the system. As a result, there is an envisioned embodiment wherein $SnO_2$ residue may be etched and cleaned from the system using hydrogen and hydrocarbon gas without necessarily forming a plasma from the hydrogen and hydrocarbon gas.

Figure 7:
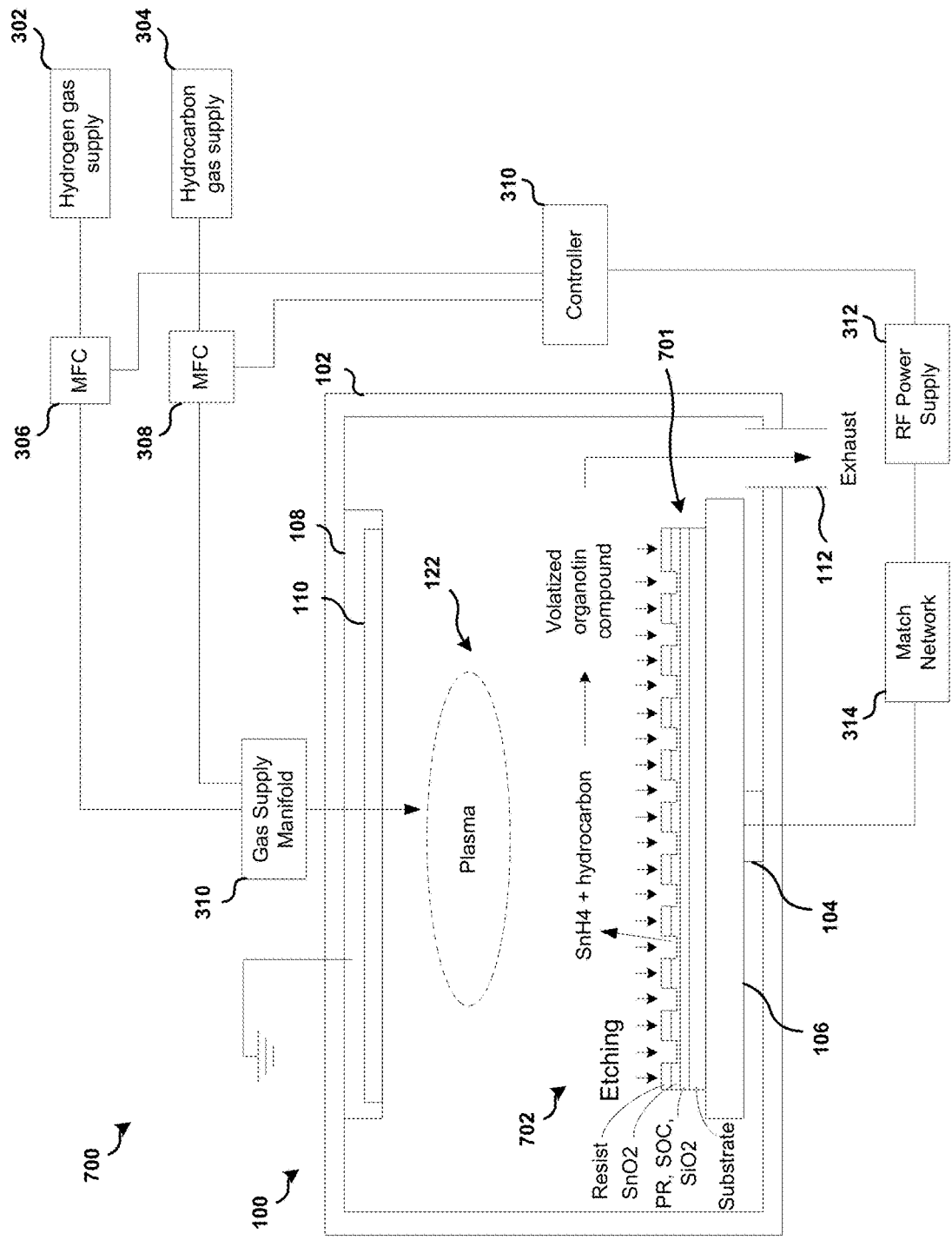
FIG. 7 shows a simplified schematic of a plasma processing system used for etching an $SnO_2$ layer in a stack, according to one embodiment.

FIG. 7 shows a simplified schematic of a plasma processing system 700 used for etching 702 an $SnO_2$ layer in a stack 701. The stack 701 being etched is shown to include a substrate such as a wafer, one or more layers that may include photoresist, spin-on-carbon, silicon dioxide, metallic layers, organometallic layers, or some other material. The stack 701 is also shown to include a layer of $SnO_2$ that is being etched and a resist for resisting the etching 702. As $SnO_2$ is being etched by plasma 122, $SnH_4$ is formed, which can decompose into Sn powder and be deposited on the substrate and other surfaces of the processing chamber 100. If Sn powder is allowed to form via $SnH_4$ decomposition defects in the patterning of the $SnO_2$ layer may occur. However, because hydrocarbon gas is also being supplied to the processing chamber 100, the $SnH_4$ reacts with hydrocarbon ions and radicals to form the volatilized organotin compound for evacuation out of the processing chamber. As a result, there is a reduction in the decomposition of $SnH_4$ into Sn powder. It is therefore also envisioned that Sn powder formation may be reduced in situ while etching an $SnO_2$ layer of a stack 701.

FIGS. 8A-8D show results of etching $SnO_2$ and the resulting formation of Sn powder using hydrogen plasma chemistry, according to various embodiments. FIG. 8A, for example, shows a wafer having been placed in a processing chamber during $SnO_2$ film etching using CCP plasma and hydrogen chemistry. The right-hand side of the wafer is shown to have accumulated Sn powder, while the left-hand side of the wafer shows the wafer having been wiped of the Sn powder. FIG. 8B likewise shows Sn powder formation when $SnO_2$ thin film is etched using a remote ICP source and hydrogen chemistry, while FIG. 8C shows the same wafer as wiped. FIG. 8D shows an X-ray scan of the wafer of FIG. 8B, demonstrating that Sn powder forms for the range of 0.5 Torr to 6 Torr for this plasma processing chamber. Additionally, it is found that Sn powder forms as a result of etching $SnO_2$ in this plasma processing chamber throughout its designated pressure ranges of 200 mTorr to 10 Torr and temperature ranges of 40° C. to 400° C.

Figure 9C:
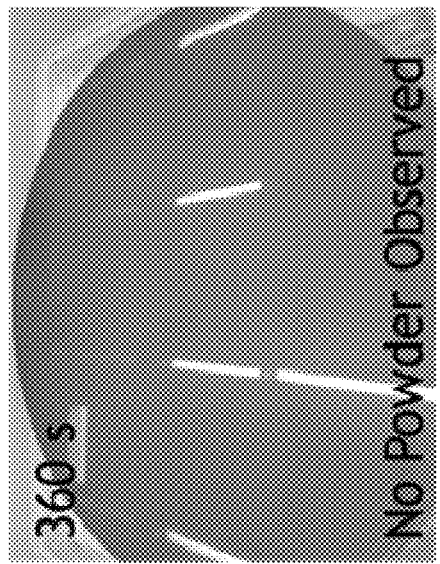
FIGS. 9A-9D shows experimental results of etching $SnO_2$ and a reduction in Sn powder formation using hydrogen and hydrocarbon plasma chemistry, according to various embodiments.
Figure 9D:
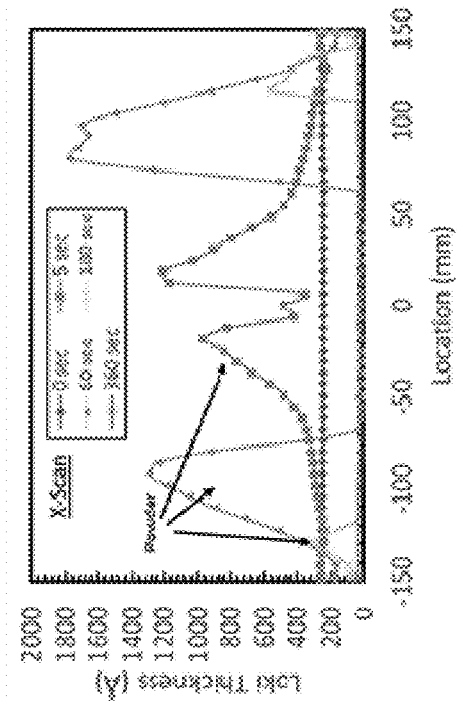
Figure 9A:
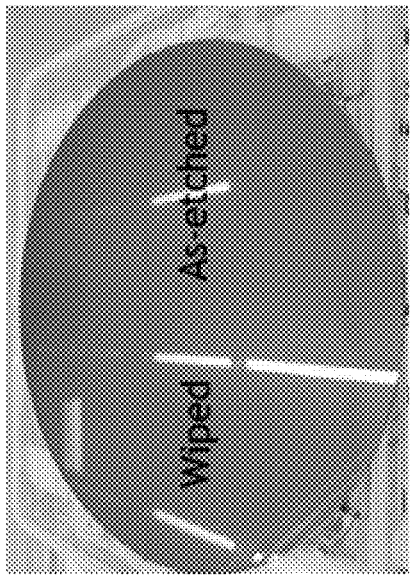
Figure 9B:
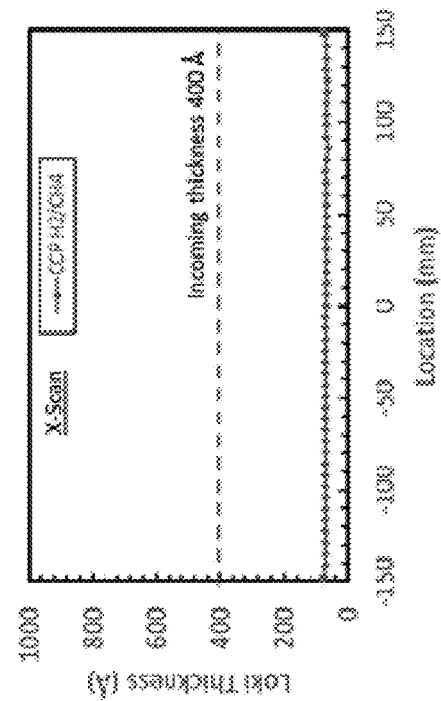

FIGS. 9A-9D shows experimental results of etching $SnO_2$ and a reduction in Sn powder formation using hydrogen and hydrocarbon plasma chemistry, according to various embodiments. In FIG. 9A, a wafer having an incoming $SnO_2$ thickness of 400 angstroms is etched using hydrogen and $CH_4$ chemistry using CCP plasma until the thickness of about 40 angstroms is reached. The right-hand side of the wafer is as-etched while the left-hand side of the wafer is wiped down, showing that Sn powder formation was reduced using the hydrogen and $CH_4$ chemistry such that there was no observable Sn powder formed on the wafer. FIG. 9B shows an X-ray scan of the wafer before and after etching with the hydrogen and $CH_4$ chemistry, confirming a uniform $SnO_2$ thickness and an absence of Sn powder formation on the wafer.

FIG. 9C shows a wafer as-etched using a remote ICP source with hydrogen and $CH_4$ chemistry for 360 seconds. Similar to the as-etched wafer shown in FIG. 9A, the ICP mode etching with hydrogen and $CH_4$ chemistry also results in no observable Sn powder formation after 360 seconds of treatment. FIG. 9D shows an X-ray scan of the thickness of as-etched wafers after 0, 5, 60, 180, and 360 seconds. Before the etch, the wafer has a thickness of about 250 angstroms of $SnO_2$. With 360 seconds of treatment, the $SnO_2$ is shown to be etched away while leaving no observable Sn powder behind. In some embodiments, treatment times of under 360 seconds may be achieved with higher densities of plasma from the remote ICP source, by optimizing the ratio of $CH_4$ flow to hydrogen flow, and by optimizing the flow of $CH_4$ and hydrogen ion and radicals from the remote ICP source to the processing chamber, as well as temperature and pressure ranges of the processing chamber.

It is noted that the wafers shown in FIGS. 8A-8C, 9A and 9B have vertically oriented white marks resulting from reflections of ceiling lights. The white marks are not indicative of any structure of the wafers as shown.

Figure 10:
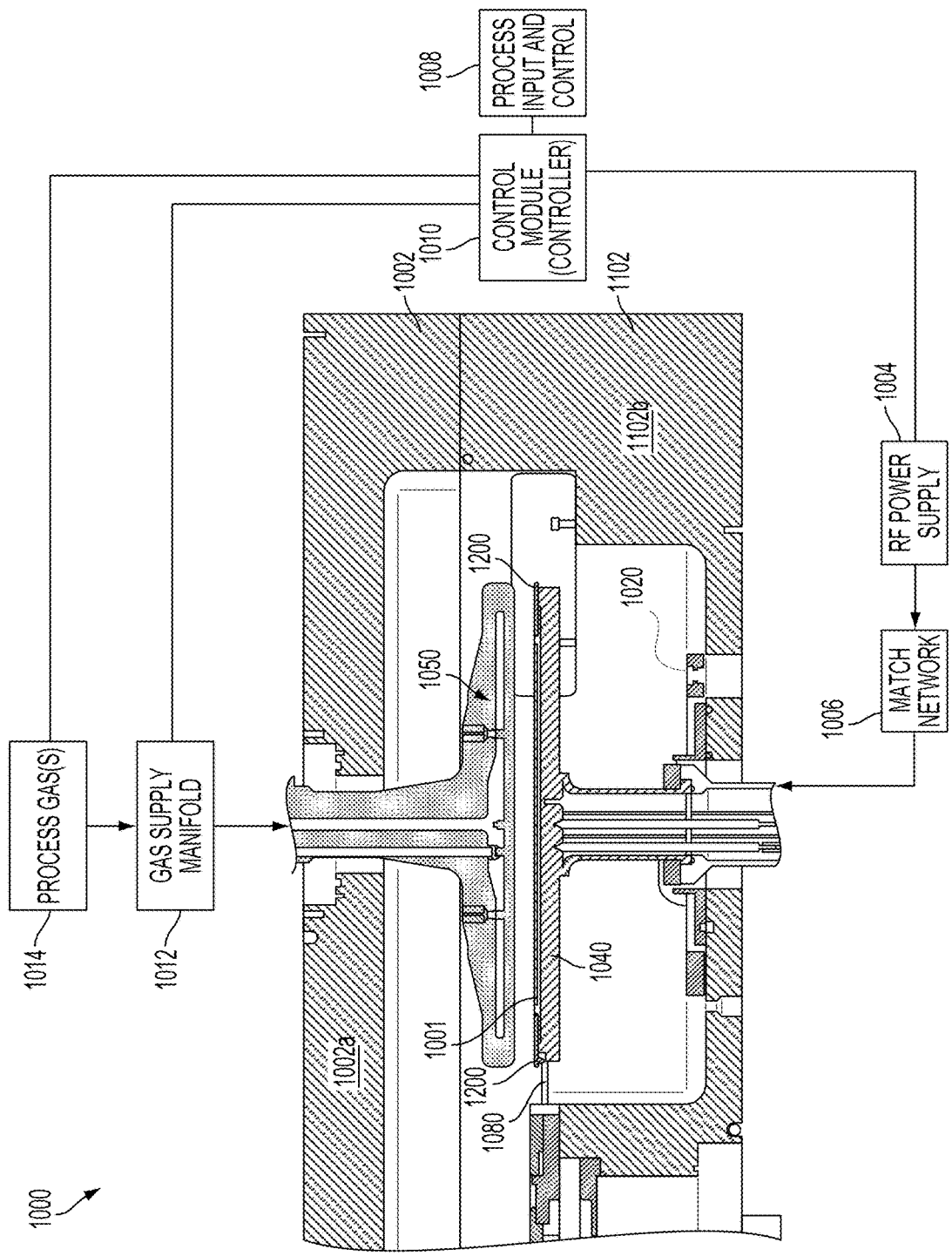
FIG. 10 illustrates a reactor system according to one embodiment, which may be used to deposit films over substrates such as those formed in atomic layer deposition (ALD) processes.

FIG. 10 illustrates a reactor system 1000, which may be used to deposit films over substrates, such as those formed in atomic layer deposition (ALD) processes. These reactors may utilize two or more heaters, and the common terminal configurations may be used in this example reactor to control the temperatures for uniformity or custom settings. More particularly, FIG. 10 illustrates a substrate processing system 1000, which is used to process a wafer 1001. The system includes a chamber 1002 having a lower chamber portion 1002b and an upper chamber portion 1002a. A center column is configured to support a pedestal 1040, which in one embodiment is a powered electrode. The pedestal 1040 is electrically coupled to power supply 1004 via a match network 1006. The power supply is controlled by a control module 1010, e.g., a controller. The control module 1010 is configured to operate the substrate processing system 1000 by executing process input and control 1008. The process input and control 1008 may include process recipes, such as power levels, timing parameters, process gasses, mechanical movement of the wafer 1001, etc., such as to deposit or form films over the wafer 1001.

The center column also includes lift pins (not shown), each of which is actuated by a corresponding lift pin actuation ring 1020 as controlled by lift pin control 1022. The lift pins are used to raise the wafer 1001 from the pedestal 1040 to allow an end-effector to pick the wafer and to lower the wafer 1001 after being placed by the end-effector. The substrate processing system 1000 further includes a gas supply manifold 1012 that is connected to process gases 1014, e.g., gas chemistry supplies from a facility. Depending on the processing being performed, the control module 1010 controls the delivery of process gases 1014 via the gas supply manifold 1012. The chosen gases are then flown into the shower head 1050 and distributed in a space volume defined between the showerhead 1050 face that faces that wafer 1001 and the wafer 1001 resting over the pedestal 1040. In ALD processes, the gases can be reactants chosen for absorption or reaction with absorbed reactants.

Further, the gases may be premixed or not. Appropriate valving and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 1200 that encircles an outer region of the pedestal 1040. The carrier ring 1200 is configured to sit over a carrier ring support region that is a step down from a wafer support region in the center of the pedestal 1040. The carrier ring includes an outer edge side of its disk structure, e.g., outer radius, and a wafer edge side of its disk structure, e.g., inner radius, that is closest to where the wafer 1001 sits. The wafer edge side of the carrier ring includes a plurality of contact support structures which are configured to lift the wafer 1001 when the carrier ring 1200 is lifted by spider forks 1080. The carrier ring 1200 is therefore lifted along with the wafer 1001 and can be rotated to another station, e.g., in a multi-station system. In other embodiments, the chamber is a single station chamber.

Figure 11:
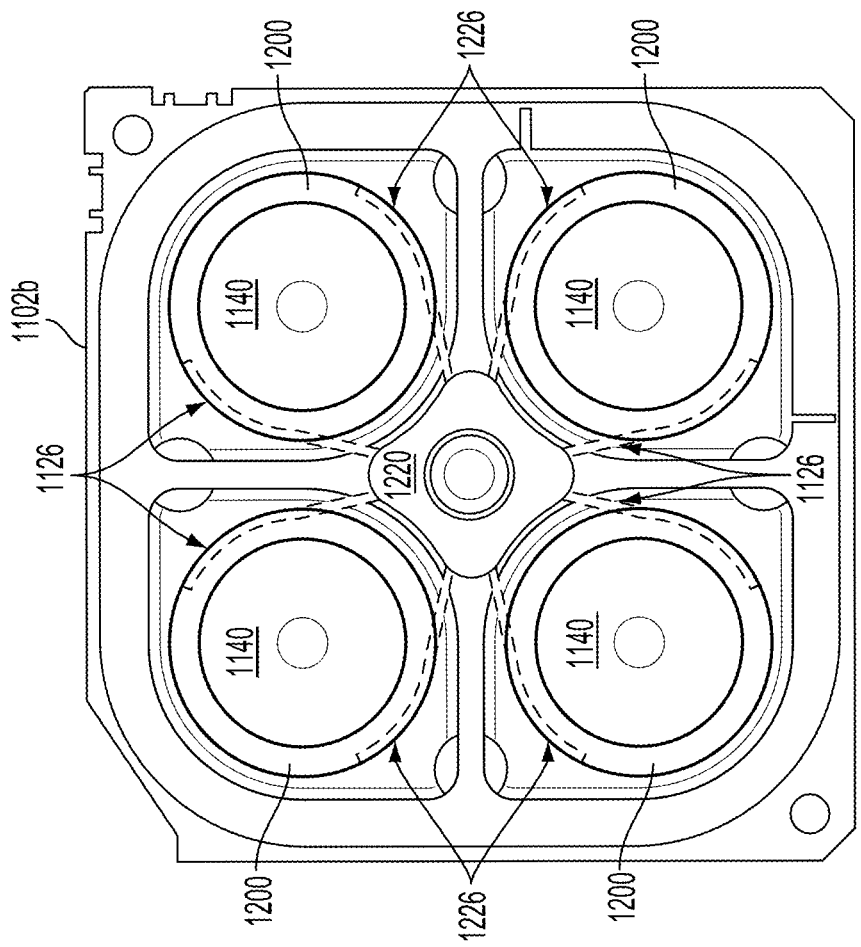
FIG. 11 illustrates a top view of a multi-station processing tool, wherein four processing stations are provided, according to one embodiment.

FIG. 11 illustrates a top view of a multi-station processing tool, wherein four processing stations are provided. This top view is of the lower chamber portion 1002b (e.g., with the top chamber portion 1002a removed for illustration), wherein four stations are accessed by spider forks 1226. Each spider fork, or fork includes a first and second arm, each of which is positioned around a portion of each side of the pedestal 1040. In this view, the spider forks 1226 are drawn in dash-lines, to convey that they are below the carrier ring 1200. The spider forks 1226, using an engagement and rotation mechanism 1220 are configured to raise up and lift the carrier rings 1200 (i.e., from a lower surface of the carrier rings 1200) from the stations simultaneously, and then rotate at least one or more stations before lowering the carrier rings 1200 (where at least one of the carrier rings 1200 supports a wafer 1001) to a next location so that further plasma processing, treatment and/or film deposition can take place on respective wafers 1001.

Figure 12:
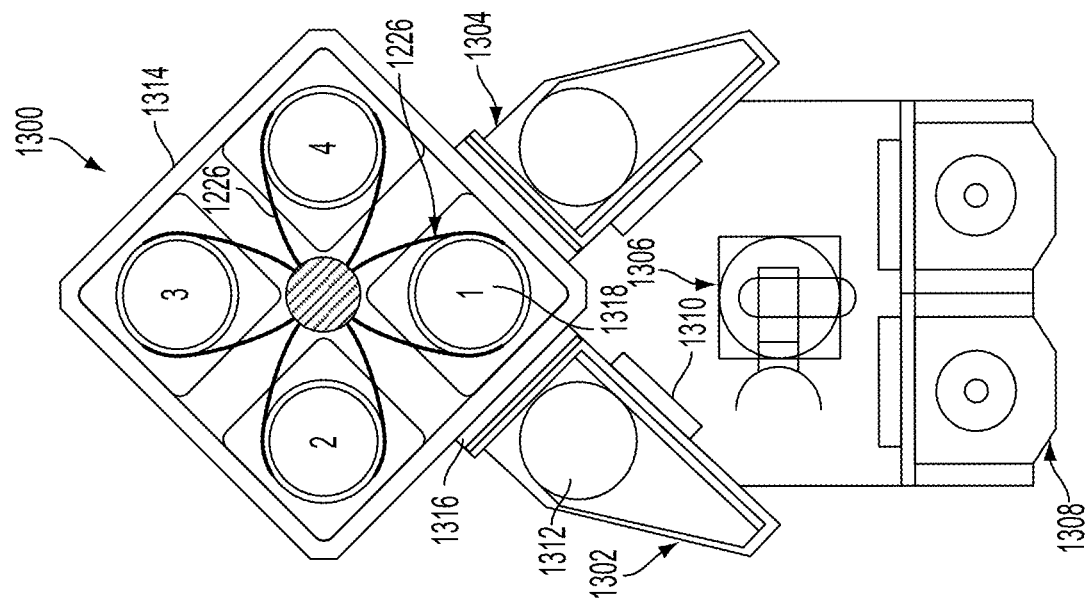
FIG. 12 shows a schematic view of an embodiment of a multi-station processing tool with an inbound load lock and an outbound load lock, according to one embodiment.

FIG. 12 shows a schematic view of an embodiment of a multi-station processing tool 1300 with an inbound load lock 1302 and an outbound load lock 1304. A robot 1306, at atmospheric pressure, is configured to move substrates from a cassette loaded through a pod 1308 into inbound load lock 1302 via an atmospheric port 1310. Inbound load lock 1302 is coupled to a vacuum source (not shown) so that, when atmospheric port 1310 is closed, inbound load lock 1302 may be pumped down. Inbound load lock 1302 also includes a chamber transport port 1316 interfaced with processing chamber 1002b. Thus, when chamber transport 1316 is opened, another robot (not shown) may move the substrate from inbound load lock 1302 to a pedestal 1040 of a first process station for processing.

The depicted processing chamber 1002b comprises four process stations, numbered from 1 to 4 in the embodiment shown in FIG. 12. In some embodiments, processing chamber 1002b may be configured to maintain a low pressure environment so that substrates may be transferred using a carrier ring 1200 among the process stations without experiencing a vacuum break and/or air exposure. Each process station depicted in FIG. 12 includes a process station substrate holder (shown at 1318 for station 1) and process gas delivery line inlets.

FIG. 12 also depicts spider forks 1226 for transferring substrates within processing chamber 1002b. The spider forks 1226 rotate and enable transfer of wafers from one station to another. The transfer occurs by enabling the spider forks 1226 to lift carrier rings 1200 from an outer undersurface, which lifts the wafer, and rotates the wafer and carrier together to the next station. In one configuration, the spider forks 1226 are made from a ceramic material to withstand high levels of heat during processing.

Computer programs for controlling delivery of process gas can be written in any conventional computer readable programming language: for example, assembly language, C, C++, Pascal, Fortran or others. Compiled object code or script is executed by the processor to perform the tasks identified in the program.

The system software may be designed or configured in many different ways. For example, various processing chamber subroutines or control objects may be written to control operation of the processing chamber components necessary to carry out the flow control processes.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications may be practiced within the scope of the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A plasma processing system, comprising: a hydrogen gas supply and a hydrocarbon gas supply; a processing chamber having a wafer support and inner surfaces that surround the wafer support; a first mass flow controller (MFC) for controlling hydrogen gas flow into the processing chamber and a second MFC for controlling hydrocarbon gas flow into the processing chamber; a plasma source for generating plasma at the processing chamber, the plasma is for etching a film of tin oxide (SnO2) formed on the inner surfaces of the processing chamber during prior substrate etching; and a controller for regulating the first MFC and the second MFC such that hydrocarbon gas flow to the hydrogen gas flow into the processing chamber is between 1% and 8% when tin hydride (SnH4) is produced during said etching of the SnO2 to clean and remove the SnO2 from the inner surfaces of the processing chamber, the SnH4 reacts with hydrocarbon gas to produce an organotin compound that is volatilizable in a reaction that is more kinetically favorable than SnH4 decomposition into Sn powder, wherein producing the organotin compound enables suction of tin (Sn) out of the processing chamber to prevent Sn powder from being deposited on the inner surfaces of the processing chamber during said etching SnO2; wherein the plasma source is set by the controller to operate at power levels between 500 watts and 5000 watts; wherein between 1% and 8% hydrocarbon gas flow to the hydrogen gas flow reduces formation of carbonaceous polymers instead of said organotin compound that is volatilizable.

2. The plasma processing system of claim 1, wherein said between 1% and 8% of the flow of hydrocarbon gas to the flow of hydrogen gas enables sufficient hydrocarbon gas for the reaction with SnH4 while preventing said formation of carbonaceous polymers and their deposition on inner surfaces of the processing chamber.

3. The plasma processing system of claim 1, wherein the inner surfaces of the processing chamber include inner walls.

4. The plasma processing system of claim 1, wherein the inner surfaces include one or more of a showerhead, an electrode, the wafer support, or a chuck.

5. The plasma processing system of claim 1, wherein the hydrogen gas flow and the hydrocarbon gas flow are provided into the processing chamber via a gas manifold that is interconnected with each of the first and second MFCs.

6. The plasma processing system of claim 1, further comprising:
a heating element for maintaining a temperature of the processing chamber as controlled by the controller to between 150° C. and 180° C.

7. The plasma processing system of claim 1, further comprising:
a vacuum unit for maintaining low pressures within the processing chamber as controlled by the controller.

8. The plasma processing system of claim 7, wherein the controller is configured to regulate the heating element to maintain a temperature between 65° C. and 300° C. for enabling volatilization of the organotin compound and suction of the organotin compound as volatilized out of the processing chamber.

9. The plasma processing system of claim 8, wherein the controller is configured to regulate the vacuum unit to maintain a pressure of the processing chamber between 1 Torr and 10 Torr for enabling reaction of $SnH_4$ with the hydrocarbon gas to produce the organotin compound.

10. A capacitively-coupled plasma processing system, comprising:
a processing chamber having an upper electrode coupled to ground and a substrate support coupled to an RF power source, the processing chamber having inner surfaces that surround the substrate support;
a hydrogen gas supply and a hydrocarbon gas supply;

a first mass flow controller (MFC) for controlling hydrogen gas flow into the processing chamber and a second MFC for controlling hydrocarbon gas flow into the processing chamber;

the RF power source for generating plasma at the processing chamber, the plasma is for etching a film of tin oxide ($SnO_2$) formed on the inner surfaces of the processing chamber during prior substrate etching; and a controller for regulating the first MFC and the second MFC such that hydrocarbon gas flow to the hydrogen gas flow into the processing chamber is between 1% and 8% when $SnH_4$ is produced during said etching $SnO_2$, and wherein the RF power source is set by the controller to operate at power levels between 500 watts and 5000 watts;

wherein between 1% and 8% hydrocarbon gas flow to the hydrogen gas flow reduces formation of carbonaceous polymers instead of producing an organotin compound that is volatilizable and removed for cleaning the inner surfaces of the processing chamber.

11. The capacitively-coupled plasma processing system of claim 10, wherein the $SnH_4$ reacts with hydrocarbon gas to produce said organotin compound that is volatilizable in a reaction that is more kinetically favorable than $SnH_4$ decomposition into Sn powder.

12. The capacitively-coupled plasma processing system of claim 11, wherein producing the organotin compound enables said removal by suction of Sn out of the processing chamber to prevent Sn powder from being deposited on the inner surfaces of the processing chamber during said etching of the $SnO_2$.

13. The capacitively-coupled plasma processing system of claim 11, further comprising:
   a heating element for maintaining a temperature of the processing chamber as controlled by the controller;
   a vacuum unit for maintaining low pressures within the processing chamber as controlled by the controller;
   wherein the controller is configured regulate the heating element to maintain a temperature between 65° C. and 300° C. for enabling volatilization of the organotin compound and suction of the organotin compound as volatilized out of the processing chamber.

14. The capacitively-coupled plasma processing system of claim 10, further comprising:
   a heating element for maintaining a temperature of the processing chamber between 150° C. and 180° C. as controlled by the controller.

\* \* \* \* \*